United States Patent [19]

Tchon

[11] 3,930,893

[45] Jan. 6, 1976

[54] CONDUCTIVITY CONNECTED CHARGE-COUPLED DEVICE FABRICATION PROCESS

[75] Inventor: Wallace Edward Tchon, Phoenix, Ariz.

[73] Assignee: Honeywell Information Systems, Inc., Phoenix, Ariz.

[22] Filed: Mar. 3, 1975

[21] Appl. No.: 554,855

[52] U.S. Cl. .................... 148/1.5; 148/187; 357/91
[51] Int. Cl.² ........................................ H01L 21/263
[58] Field of Search ................ 148/1.5, 187; 357/91

[56] References Cited
UNITED STATES PATENTS

| | | | |
|---|---|---|---|
| 3,650,019 | 3/1972 | Robinson | 148/1.5 X |
| 3,852,119 | 12/1974 | Gosney et al. | 148/1.5 |
| 3,853,634 | 12/1974 | Amelio et al. | 148/1.5 |
| 3,865,652 | 2/1975 | Agusta et al. | 148/187 |
| 3,892,596 | 7/1975 | Bjorklund et al. | 148/1.5 |

OTHER PUBLICATIONS

1973 International Elec. Dev. Meeting, Tech. Digest, "A High Density Overlapping Gate C.C.D. Array," Bower et al., pp. 30–32.

Primary Examiner—L. Dewayne Rutledge
Assistant Examiner—J. M. Davis
Attorney, Agent, or Firm—Edward W. Hughes; Walter W. Nielsen

[57] ABSTRACT

A method of fabricating conductivity connected charge-coupled devices (C4D's) is disclosed wherein N+ barriers are ion-implanted in an N-type substrate and wherein P++ conductivity connecting regions are formed by diffusion of impurity atoms into the substrate. The process is compatible with the known silicon gate process, enabling semiconductor devices of other types and with different thresholds to be formed on the substrate at the same time the C4D's are fabricated.

11 Claims, 13 Drawing Figures

CONDUCTIVITY CONNECTED CHARGE-COUPLED DEVICE FABRICATION PROCESS

BACKGROUND OF THE INVENTION

The invention relates generally to a process for fabricating semiconductor devices, and, more particularly, to a process for fabricating conductivity connected charge-coupled devices (C4D's).

A known process for the fabrication of C4D's, used by Bell Laboratories, comprises essentially the following sequence of steps. A layer of thick oxide is initially grown on a semiconductor substrate. The thick oxide layer is subsequently etched to expose the barrier regions which are to be implanted, as well as the regions between the channels, a channel constituting a succession of individual C4D storage cells. Next another layer of oxide is grown and etched to expose only the implant regions of the substrate. This is followed by the implantation of the barrier regions. All oxide is then removed, and the field oxide layer is grown and etched. Next the gate oxide is laid down in what is referred to in the semiconductor art as a "high temperature step." A refractory material such as tungsten is next deposited and etched to define the electrodes as well as the intervening conductivity connecting regions. Finally the conductivity connecting regions are implanted, and the entire device is subjected to a further high temperature step in order to activate the conductivity connecting regions.

SUMMARY OF THE INVENTION

According to a preferred embodiment of the present invention, a sequence of process steps is disclosed for the fabrication of C4D's wherein certain disadvantages of the known prior art process and the device resulting therefrom are overcome.

Charge-coupled devices having conductivity connecting regions formed by ion implantation are inherently slower in operation than C4D's in which the conductivity connection regions are formed by a diffusion process, due to the fact that in ion-implanted regions damage is done to the crystal lattice structure as a result of the ion bombardment, causing such regions to have relatively greater electrical resistivity than conductivity connecting regions formed by a diffusion process. Therefore, the diffusion of the conductivity connecting region is preferable over an ion implantation step.

However, a limiting factor exists regarding the use of the diffusion step, in that such is a so-called high temperature step. In the course of the procedure for diffusing impurity atoms into the substrate, the substrate is subjected to high temperature in order to drive in the impurity atoms. Such high temperature step has a deleterious effect on any earlier implanted or diffused impurity regions, since a portion of the impurity atoms are thereby dispersed from such regions. Normally this effect can be tolerated to a certain degree, and thus the subjection of previously made impurity regions to one high temperature step is acceptable. However, subjection of such regions to two or more high temperature steps can be expected to yield undesirable results. The present invention sets forth a process for making C4D's of the type having conductivity connecting regions produced by the diffusion method, in which a minimum number of high temperature steps are required. The resulting device therefore has improved operating characteristics over that produced by the known method of fabricating C4D's.

On a chip containing C4D's, it is often desirable to include certain peripheral circuitry implemented in MOSFET (metal oxide semiconductor field effect transistor) device technology. For example, in an LSI (large scale integrated circuit memory comprising a plurality of C4D registers it is useful to fabricate the required control circuitry, implemented in MOSFET technology, on the same chip as the C4D registers. To do so requires that the C4D process be as compatible with the MOSFET process as possible, in order to mitigate process costs and maintain yields.

The present invention discloses a C4D process which is very compatible with the known "silicon gate process", since according to the present invention, the additional MOSFET circuits on an LSI circuit chip comprising C4D circuits may be made concurrently with the C4D circuits, as opposed to being made subsequently to the C4D circuits or requiring extra process steps. As a result, such chips may be made at substantial cost savings. The present invention also discloses a process for making additional MOSFET devices in which the resulting MOSFET devices have different thresholds.

OBJECTS OF THE INVENTION

Accordingly, it is a principal object of the present invention to provide an improved process for fabricating charge-coupled semiconductor devices.

It is another object of this invention to provide a process for fabricating conductivity connected charge-coupled devices, which process results in a high yield of good devices.

It is also an object of the invention to provide a process for fabricating conductivity connected charge-coupled devices and MOSFET semiconductor devices on a single chip substantially concurrently.

It is yet another object of the invention to provide a process for fabricating conductivity connected charge-coupled devices and MOSFET semiconductor devices having different thresholds on a single chip substantially concurrently.

BRIEF DESCRIPTION OF THE DRAWING

The invention will be described with reference to the accompanying drawing, wherein.

DETAILED DESCRIPTION OF THE PREFERRED EMBODIMENT

Figure 1A:
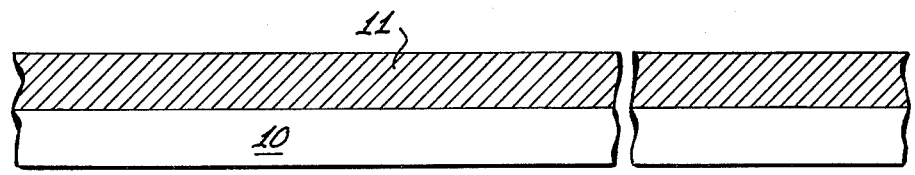
FIGS. 1a through 1k illustrate the basic steps of the disclosed process for fabricating charge-coupled devices.

With reference now to FIGS. 1a to 1k of the drawing, the sequence of basic process operations of a preferred embodiment of the present invention will be described. FIGS. 1a to 1k illustrate in the left-hand portions thereof a sequence of cross-sectional schematic diagrams depicting the basic steps employed in fabricating a portion of a charge-coupled device. The right-hand portions of FIGS. 1a to 1k illustrate a sequence of cross-sectional schematic diagrams depicting the basic steps employed in fabricating a MOSFET semiconductor device situated on the same semiconductor substrate as the charge-coupled device illustrated in the left-hand portions of FIGS. 1a to 1k.

In FIG. 1a is shown a substrate 10 of N-type semiconductor material over which has been laid a layer of thick oxide 11, also known as field oxide or steam oxide. The thick oxide layer 11 functions to separate adjacent rows of charge-coupled devices. Other means of isolating adjacent rows are possible but not shown, such as channel stop implantation. The field oxide layer 11 is shown by a dotted line in the left-hand portion of FIG. 1b and is not depicted in the corresponding portions of FIGS. 1c through 1k for the sake of clarity, since it is desirable to concentrate primarily on the actual row or channel construction itself.

Figure 1B:
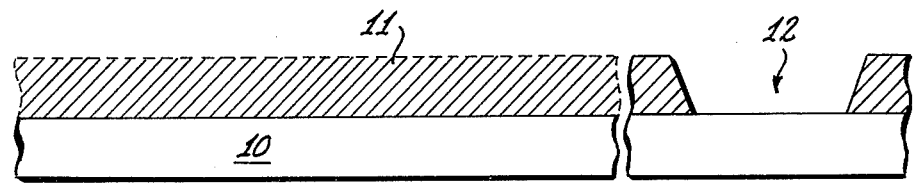

FIG. 1b illustrates the etching away of the thick oxide 11 in the region of the gate 12 of the MOSFET device. Throughout the description of the present invention, the various steps involving etching, masking, oxide formation, ion implantation, diffusion, etc. will not be discussed individually in detail, since they are individually known in the semiconductor technology and as such form no part of the present invention.

Figure 1C:
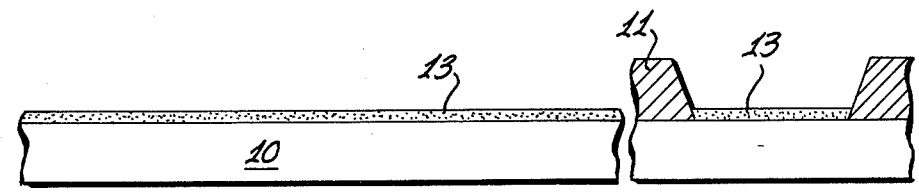

In FIG. 1c, the step of laying down the gate oxide 13 is shown. As previously mentioned, the step of growing the gate oxide 13, also known as thermal oxide, involves a high temperature process. In the right-hand portion of FIG. 1c, the application of the gate oxide layer 13 to the previously existing thick oxide layer 11 is not shown for the purpose of clarity, since, as regards the thick oxide layer 11, the application to it of a thin gate oxide 13 effects no significant change.

Figure 1D:
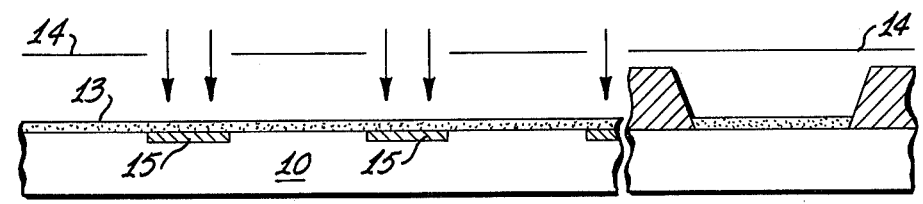

Subsequent to deposition of the gate oxide layer 13, a mask 14 is applied to same, such mask 14 having openings therein of predetermined size and location. No openings are present in the portion of mask 14 overlying the MOSFET region. Each opening in the mask 14 represents the location of a desired N+ barrier implant region 15 having a different semiconductor resistivity than the N-type substrate 10. With the mask 14 in place, as shown in FIG. 1d, a phosphorous dose of approximately $10^{12}$ atoms/cm$^2$ is performed to produce the N+ barrier regions 15. The mask 14 is then removed. It will be understood that where selective etching or implantation is desired, known photoresist techniques may be substituted for and are deemed equivalent in function to masking techniques.

Figure 1E:
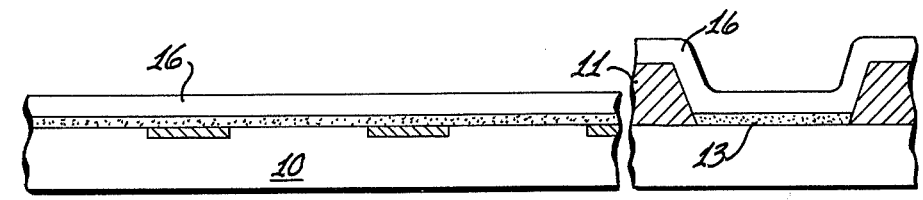
Figure 1F:
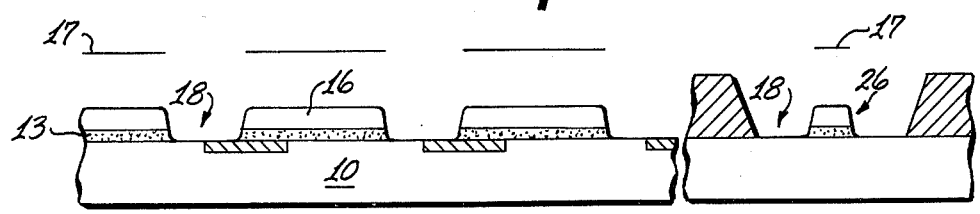

The next process step, shown in FIG. 1e, is the deposition of a uniform layer of polysilicon 16. A second mask 17 is then laid over the layer of polysilicon 16, as shown by FIG. 1f, such mask 17 having holes in the left-hand portion thereof representing the desired locations of the conductivity connecting regions 19 of the completely fabricated charge-coupled device (see FIGS. 1g and 1k). The right-hand side of mask 17, overlying the MOSFET portion of the chip, is essentially open everywhere except over the gate area 26. One or more etchants are applied to the second mask 17 whereby the exposed portions of polysilicon 16 and gate oxide layer 13 are etched down to the surface of the silicon substrate 10, leaving holes 18.

Figure 1G:
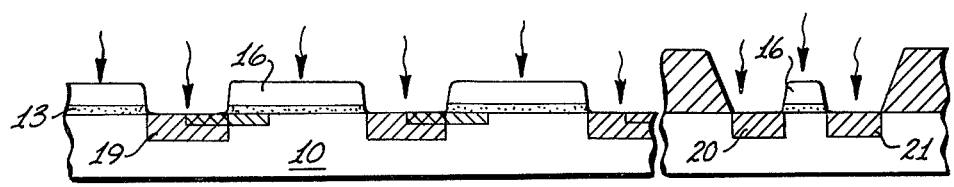

Next, according to FIG. 1g, the polysilicon electrodes 16 and P++ conductivity connecting regions of the C4D are simultaneously doped by a diffusion of boron atoms at $10^{18}$ to $10^{21}$ atoms/cm$^3$. At the same time the source and drain regions 20 and 21, respectively, of the MOSFET device are also diffusion doped. The barrier implant regions 15 and diffusion regions 19 of the C4D, as well as the source and drain regions 20 and 21 of the MOSFET device, are activated by the diffusion step, which is a high temperature step. No further high temperature steps are required. However, a subsequent heat treatment step of relatively less duration than the diffusion step may be performed without harmful effect, if such is necessary to more fully activate the implant regions, to correct a surface effects problem, etc. The N+ barrier regions 15 are recompensated by P-type silicon as a result of being subjected to the relatively heavy P++ diffusion doping.

Figure 1H:
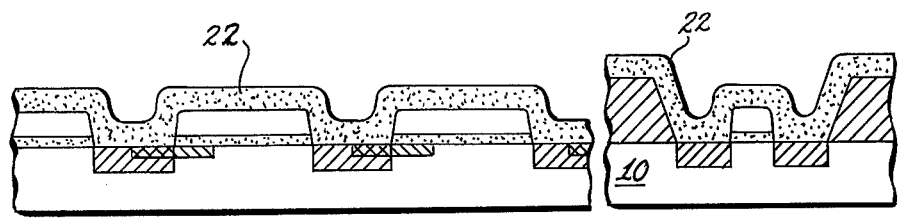

The next step is the deposition of a third layer of oxide 22, known as intermediate oxide, as shown in FIG. 1h. The intermediate oxide layer 22 aids in sealing the C4D and in insulating the polysilicon layer 16 from the yet to be laid metallization layer 24 of the MOSFET device. At this point in the sequence of process steps, the fabrication of the charge-coupled device portion of the chip is complete, and therefore FIGS. 1i and 1j omit the charge-coupled device portion of the chip for the sake of clarity. All that remains to be done at this juncture are the steps required to complete the desired MOSFET circuitry.

Figure 1I:
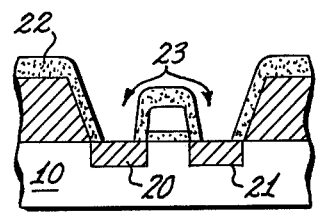

The intermediate oxide layer 22 is next selectively etched down to the substrate 10, according to FIG. 1i, in the locations of the desired source and drain regions 20 and 21, respectively, of the MOSFET device.

Figure 1J:
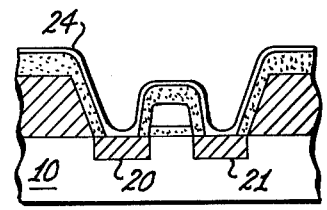

Next, FIG. 1j illustrates the laying down of a suitable metallization layer 14 over the entire MOSFET device. Finally, the metallization layer 24 is etched in the gate region leaving a gap 25 for the purposes of electrically isolating the source region 20 from the drain region 21. This step, illustrated in FIG. 1k, completes the fabrication of the MOSFET circuitry, and indeed the entire sequence of basic fabrication steps necessary to make the C4D and associated MOSFET devices.

Figure 1K:
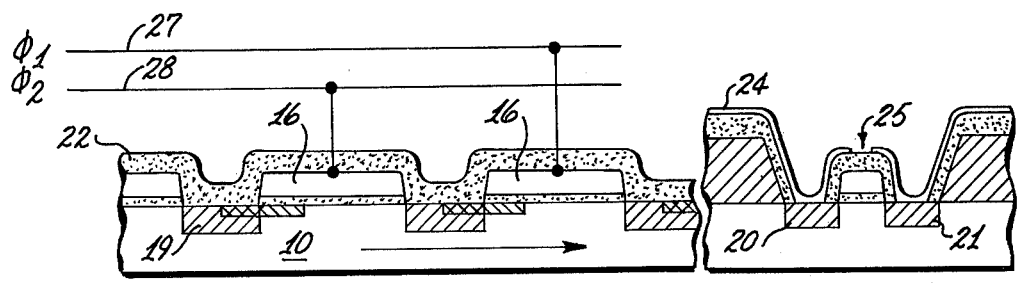

FIG. 1k, in the left-hand portion thereof, illustrates a possible clocking connection to the C4D. The clock phase lines 27 and 28 are connected to alternate electrodes 16. The alternate application of the $\phi 1$ and $\phi 2$ clock voltages to the electrodes 16 causes the incremental movement of charge packets from left to right in the FIG. 1k illustration in a manner which is known in the art. While the electrical connections to the $\phi 1$ and $\phi 2$ clock lines 27 and 28, respectively, are shown to be in the vicinity of the cross-sectional slice (i.e., in the region of charge storage and charge transfer), in actuality such electrical connections will normally be effectuated at the remote edge of the device (not shown) in a manner which is well known.

Typical values for the dimensions of the constituent elements of the preferred embodiment of the C4D shown in FIGS. 1a through 1b are 3000–5000A for the polysilicon electrodes 16, 1000–2000A for the gate oxide layer 13, 2000A for the N+ barrier regions 15, approximately 1 micron for the P++ conductivity connecting regions 19, and 3 to 10 mils for the silicon substrate 10 proper. It will be understood that these values are not necessarily optimized, and that one skilled in the art will be capable of making modifications to the preferred embodiment according to the desired performance requirements of the fabricated C4D.

Figure 2A:
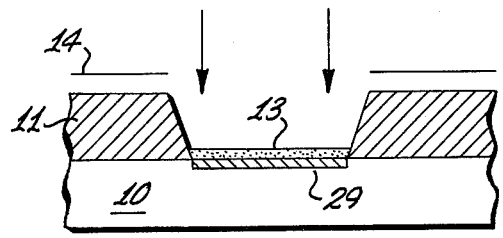
FIGS. 2a and 2b illustrate the basic steps of a modification of the process shown in FIGS. 1a through 1k.
Figure 2B:
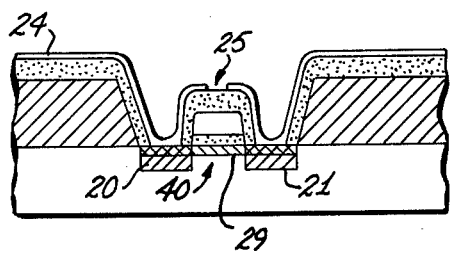

Referring now to FIGS. 2a and 2b, a modification of the sequence of basic process steps shown by FIGS. 1a through 1k will be described. Regarding the MOSFET devices formed on the same substrate as the CCD devices, it is often desirable to provide MOSFET devices having different thresholds. According to the present invention, MOSFET devices having different thresholds are fabricated by forming the gate region of each of a first group of MOSFET devices over undoped N-type substrate material, as previously shown in FIG. 1g, and by forming the gate region in each of a second group of such devices over a substrate region which has been doped by ion implant to N+.

Specifically the first group of MOSFET devices may be regarded as that formed in the previously-described sequence of basic steps shown in FIGS. 1a through 1k. The sequence of steps for the fabrication of the second group of MOSFET devices, which are to have a different threshold, is identical to that used to produce the first group, with the exception of the step shown by FIG. 1d. Rather than masking off the second MOSFET group, as is done in the step shown in FIG. 1d, holes are provided in mask 14 (refer to FIG. 2a) overlying the desired gate regions 29 of the second group of MOSFET devices, and such regions 29 are ion-implanted at the same time as the barrier regions 15 of the C4D's.

The resulting MOSFET device of the second group of MOSFET devices is shown in FIG. 2b. The chief difference lies in the resistivity of the substrate region underlying the gate region 40, as such region 40 in the FIG. 2b device has a different resistivity than the corresponding region in the FIG. 1k device, because in the former device the substrate region has been doped by ion implant N+. The thresholds are accordingly different as between the two MOSFET devices.

The present invention has a number of unique advantages over the known process of fabricating C4D's. First, it is highly compatible with the standard silicon gate process, so that non-C4D circuits may be formed on a chip substantially concurrently with C4D circuits. A modification of the preferred embodiment has been shown in which the non-C4D circuits may be fabricated so as to have different thresholds without requiring any extra masks. The same diffusion step which is used to produce the conductivity connecting regions of the C4D, to dope the polysilicon electrodes of the C4D, and to activate the ion implant regions, is used to produce the source and drain diffusions of the MOSFET circuits. As a result, fewer process steps are performed and greater yields result.

Secondly, the present invention produces a C4D in which the conductivity connecting regions are produced by a diffusion step, resulting in a C4D capable of greater reliability and higher frequency of operation than a C4D in which the conductivity connecting regions are produced by an ion implantation step.

Thirdly, the sequence of process steps disclosed herein for the fabrication of a C4D requires at least one less high temperature step, resulting in a greater yield of good C4D's.

It will be apparent to those skilled in the art that the disclosed C4D fabrication process may be modified in numerous ways and may assume many embodiments other than the preferred form specifically set out and described above. For example, while the preferred embodiment is discussed in terms of an N-type substrate having N+ barrier implant regions and P++ diffusion conductivity connecting regions, the herein disclosed process could be modified to produce devices on a P-type substrate having P+ barrier implant regions and N++ diffusion conductivity connecting regions.

Furthermore, with a suitable variation of the herein described process and an appropriate combination of implant and substrate types it is possible to fabricate both enhancement mode and depletion mode devices.

It is also possible to modify the above-described sequence of basic steps by etching only through the polysilicon layer 16 in the step shown in FIG. 1f and producing the P++ conductivity connecting regions shown in FIG. 1g by an ion implantation step. Such modified sequence has the advantage that the gate oxide layer 13 is not broken, resulting in relatively higher yields. However, as mentioned earlier, conductivity connecting regions formed by an ion implantation step have relatively greater electrical resistivity than corresponding regions formed by a diffusion step, at least insofar as state-of-the-art ion implantation techniques are concerned.

Accordingly, it is intended by the appended claims to cover all modifications of the invention which fall within the true spirit and scope of the invention.

What is claimed is:

1. A method of fabricating a charge-coupled semiconductor device, said method comprising the steps of:
    A. applying a layer of gate oxide on a substrate of semiconductor material;
    B. applying a first mask to the layer of gate oxide, said first mask having openings therein of predetermined size and location relative to one another;
    C. implanting regions in said substrate of a different semiconductor resistivity than said substrate through the holes in said first mask;
    D. removing said first mask from said substrate;
    E. applying a layer of polysilicon over said gate oxide layer;
    F. applying a second mask to said layer of polysilicon, said second mask having holes therein of different location than the holes of said first mask;
    G. removing the portions of said layers of polysilicon and gate oxide underlying said holes in said second mask;
    H. doping the remaining portions of said polysilicon and the portions of said substrate underlying the removed portions of said polysilicon and gate oxide layers by adding impurity atoms to same.

2. The method according to claim 1, wherein said substrate is comprised of N-type semiconductor material and said regions of different semiconductor resistivity are comprised of N-type silicon which has been doped substantially more than said substrate.

3. The method according to claim 2, wherein said doped portions of said substrate are comprised of P-type silicon.

4. The method according to claim 1, wherein said substrate is comprised of P-type semiconductor material and said regions of different semiconductor resistivity are comprised of P-type silicon which has been doped substantially more than said substrate.

5. The method according to claim 4, wherein said doped portions of said substrate are comprised of N-type silicon.

6. A method of fabricating charge-coupled semiconductor devices on a first portion of a semiconductor substrate and fabricating metal oxide semiconductor devices on a second portion of the same substrate, said method comprising the steps of:
    A. applying a layer of thick oxide to said semiconductor substrate;
    B. removing said thick oxide layer at predetermined locations of said first and second portions of said substrate;
    C. applying a layer of gate oxide;

D. applying a first mask to the layer of gate oxide, said first mask having openings of predetermined size and location relative to one another in that part of said first mask overlying said first portion of said substrate, and said first mask having no openings in that part of said first mask overlying said second portion of said substrate;

E. implanting regions in said substrate of a different semiconductor resistivity than said substrate through the holes of said first mask;

F. removing said first mask from said substrate;

G. applying a layer of polysilicon over said gate oxide layer;

H. applying a second mask to said layer of polysilicon, said second mask having holes therein of different location than the holes of said first mask;

I. removing the portions of said layers of polysilicon and gate oxide underlying said holes in said second mask;

J. removing said second mask;

K. doping the remaining portions of said polysilicon and the portions of said substrate underlying the removed portions of said polysilicon and gate oxide layers by diffusing impurity atoms into same;

L. applying a layer of third oxide to said second portion of said substrate;

M. removing said layer of third oxide overlying those portions of the second portion of said substrate which were doped in step K;

N. applying a layer of metal over said second portion of said substrate; and

O. removing portions of said layer of metal at predetermined locations of said second portion of said substrate.

7. The method according to claim 6, wherein said substrate is comprised of N-type semiconductor material, said regions of different semiconductor resistivity are comprised of N-type silicon which has been doped substantially more than said substrate, and wherein said doped portions of said substrate are comprised of P-type silicon.

8. The method according to claim 6, wherein said substrate is comprised of P-type semiconductor material, said regions of different semiconductor resistivity are comprised of P-type silicon which has been doped substantially more than said substrate, and wherein said doped portions of said substrate are comprised of N-type silicon.

9. A method of fabricating charge-coupled semiconductor devices on a first portion of a semiconductor substrate, fabricating metal oxide semiconductor devices on a second portion of the same substrate, and fabricating metal oxide semiconductor devices on a third portion of the same substrate, said devices on said third portion having a different threshold than those on said second portion, said method comprising the steps of:

A. applying a layer of thick oxide to said semiconductor substrate;

B. removing said thick oxide layer at predetermined locations of said first, second and third portions of said substrate;

C. applying a layer of gate oxide;

D. applying a first mask to the layer of gate oxide, said first mask having openings of predetermined size and location relative to one another in those portions of said first mask overlying said first and third portions of said substrate, and said first mask having no openings in that part of said first mask overlying said second portion of said substrate;

E. implanting regions in said substrate of a different semiconductor resistivity than said substrate through the holes of said first mask;

F. removing said first mask from said substrate;

G. applying a layer of polysilicon over said gate oxide layer;

H. applying a second mask to said layer of polysilicon, said second mask having holes therein of different location than the holes of said first mask;

I. removing the portions of said layers of said polysilicon and gate oxide underlying said holes in said second mask;

J. removing said second mask;

K. doping the remaining portions of said polysilicon and the portions of said substrate underlying the removed portions of said polysilicon and gate oxide layers by diffusing impurity atoms into same;

L. applying a layer of third oxide to said second and third portions of said substrate;

M. removing said layer of third oxide overlying those portions of the second and third portions of said substrate which were doped in step K;

N. applying a layer of metal over said second and third portions of said substrate; and O. removing portions of said layer of metal at predetermined locations of said second and third portions of said substrate.

10. The method according to claim 6, wherein said substrate is comprised of N-type semiconductor material, said regions of different semiconductor resistivity are comprised of N-type silicon which has been doped substantially more than said substrate, and wherein said doped portions of said substrate are comprised of P-type silicon.

11. The method according to claim 9, wherein said substrate is comprised of P-type semiconductor material, said regions of different semiconductor resistivity are comprised of P-type silicon which has been doped substantially more than said substrate, and wherein said doped portions of said substrate are comprised of N-type silicon.

* * * * *